United States Patent
Suzuki et al.

(10) Patent No.: US 10,244,642 B2
(45) Date of Patent: Mar. 26, 2019

(54) ELECTRONIC CONTROL DEVICE

(71) Applicant: MEIDENSHA CORPORATION, Tokyo (JP)

(72) Inventors: Tetsuji Suzuki, Inazawa (JP); Shoji Hara, Nagoya (JP); Masako Umebachi, Nagoya (JP)

(73) Assignee: MEIDENSHA CORPORATION, Tokyo (JP)

( * ) Notice: Subject to any disclaimer, the term of this patent is extended or adjusted under 35 U.S.C. 154(b) by 0 days.

(21) Appl. No.: 15/740,216

(22) PCT Filed: Jun. 30, 2016

(86) PCT No.: PCT/JP2016/069391
§ 371 (c)(1),
(2) Date: Dec. 27, 2017

(87) PCT Pub. No.: WO2017/002897
PCT Pub. Date: Jan. 5, 2017

(65) Prior Publication Data
US 2018/0192526 A1  Jul. 5, 2018

(30) Foreign Application Priority Data

Jun. 30, 2015  (JP) ................................ 2015-130602

(51) Int. Cl.
*H05K 5/00* (2006.01)
*H05K 5/03* (2006.01)
(Continued)

(52) U.S. Cl.
CPC ......... *H05K 5/0017* (2013.01); *H05K 5/0008* (2013.01); *H05K 5/0052* (2013.01);
(Continued)

(58) Field of Classification Search
CPC ...... H05K 5/0017; H05K 5/0008; H05K 5/03; H05K 5/064; H05K 5/069; H05K 7/20418
(Continued)

(56) References Cited

U.S. PATENT DOCUMENTS 4,212,415 A * 7/1980 Neely .................... B65D 11/10
                                              220/324
4,453,646 A * 6/1984 Harrild .............. B65D 43/0212
                                              220/258.5
(Continued)

FOREIGN PATENT DOCUMENTS

JP          7-321478 A    12/1995
JP     2007-266527 A    10/2001
(Continued)

*Primary Examiner* — Hung S. Bui
(74) *Attorney, Agent, or Firm* — Foley & Lardner LLP

(57) ABSTRACT

Electronic component unit (20) is received in inside of housing (1) prepared by joining base (2) and cover (3). Sealing groove (24) for sealing material (24*a*) is formed on joining surface (21) of base (2). Protruding rib (35) fittable into seal groove (24) is formed on joining surface (33) of cover (3). Furthermore, spring hook portion (4) is provided to be positioned outside of the joining surfaces (21, 33) on an outer peripheral side of housing (1). Spring hook portion (4) is structured to include flexible portion (41) that extends to span between outer peripheral surfaces of base (2) and cover (3) and that is formed into a beam supported at only one end thereof on the outer peripheral surface of cover (3), and engaging portion (40) that is formed on a tip end side of flexible portion (41) and is engaged with the outer peripheral surface of base (2).

7 Claims, 10 Drawing Sheets

(51) Int. Cl.
*H05K 5/06* (2006.01)
*H05K 7/20* (2006.01)

(52) U.S. Cl.
CPC .............. *H05K 5/03* (2013.01); *H05K 5/062* (2013.01); *H05K 5/063* (2013.01); *H05K 5/064* (2013.01); *H05K 5/069* (2013.01); *H05K 7/20418* (2013.01)

(58) Field of Classification Search
USPC ................................ 361/752, 730, 796, 800
See application file for complete search history.

(56) References Cited

U.S. PATENT DOCUMENTS

| | | | |
|---|---|---|---|
| 4,620,061 A * | 10/1986 | Appleton | H02G 3/088 174/51 |
| 5,574,254 A | 11/1996 | Mori et al. | |
| 5,650,591 A * | 7/1997 | Matsushita | B60R 16/0239 174/17 CT |
| 6,344,612 B1 * | 2/2002 | Kuwahara | H01L 31/048 174/50 |
| 6,628,523 B2 * | 9/2003 | Kobayashi | H05K 5/0047 361/736 |
| 9,504,175 B2 * | 11/2016 | Farquhar | H05K 5/0208 |
| 2002/0084271 A1 * | 7/2002 | Sato | H02G 3/088 220/3.8 |

FOREIGN PATENT DOCUMENTS

| | | |
|---|---|---|
| JP | 2004-196134 A | 7/2004 |
| JP | 4363900 B2 | 11/2009 |
| JP | 2011-176199 A | 9/2011 |
| JP | 4810955 B2 | 11/2011 |
| JP | 2014-027773 A | 2/2014 |
| JP | 5424053 B2 | 2/2014 |
| JP | 2014-063867 A | 4/2014 |

\* cited by examiner (A)

(B)

(A)

(B)

(A)

(B)

(A)

(B)

ELECTRONIC CONTROL DEVICE

TECHNICAL FIELD

The present invention relates to an electronic control device where an electronic component unit is received in a protective space inside of a housing.

BACKGROUND ART

A vehicle-mounted electronic control device, such as a general motor-driving inverter device, has a structure where an electronic component unit equipped with a semiconductor switching element, a control circuit, etc. is received in a protective space (a space provided with waterproofing, etc.) inside of a housing prepared by assembling and joining a plurality of housing members (for example, Patent Publications 1 and 2).

As a specific example of the electronic control device, there is known a structure in which two housing members (housing members, etc. to be opposingly arranged and joined) to be joined with each other are fastened by a fastening means (screw, etc.) for joining in a condition an elastic packing (rubber packing, etc.) is interposed between their joining surfaces to seal the joining surfaces (for example, Patent Publication 3). Furthermore, there is also known a structure in which a sealing groove is formed on the joining surface of one housing member, and they are fastened together by a fastening means for joining in a condition where an elastic packing is fitted into the sealing groove (for example, Patent Publications 4 and 5). Besides, instead of applying an elastic packing, it is possible to think of a structure in which they are joined in a condition that the sealing groove is filled with a sealing material (a sealing material with fluidity and adhesion, such as liquid gasket), and then the joining surfaces are sealed by hardening the sealing material.

PRIOR ART PUBLICATIONS

Patent Publications

Patent Publication 1: JP Patent 4810955
Patent Publication 2: JP Patent Application Publication 2007-266527
Patent Publication 3: JP Patent 4363900
Patent Publication 4: JP Patent Application Publication 2004-196134
Patent Publication 5: JP Patent 5424053

SUMMARY OF THE INVENTION

In a method of applying an elastic packing, however, the elastic packing is required to have durability (elasticity, etc. against fastening of the fastening means). In a condition where the durability is insufficient (for example, settling, etc.), there is a risk that a desired sealing property cannot be obtained. Furthermore, even if a desired positioning of two housing members has been made, there is a risk that a positional displacement may occur depending on the fastening force, etc. if they are simply fastened together by a fastening means.

In a method of applying a sealing material in place of applying an elastic packing, there is a risk that a positional displacement, etc. (positional displacement and/or separation, for example, by transportation, assembly operation, etc.) may occur by the time when the sealing material is hardened.

In view of such technological task, the present invention was made, and its object is to provide an electronic control device that is capable of joining two housing members, while suppressing a positional displacement, etc., to obtain a desired sealing property on the joining surfaces.

An electronic control device according to this invention is a creation capable of solving the task. According to its one aspect, there is provided one comprising a housing having at least first and second housing members that are joined together and that respectively have joining surfaces sealed; a sealing groove that is formed on the joining surface of one of the first and second housing members and that is filled with a sealing material; a protruding rib that is formed on the joining surface of another of the first and second housing members and that is fitted into the sealing groove; a spring hook portion that is positioned outside of the joining surfaces on an outer peripheral side of the housing; and an electronic component unit that is received in a space inside of the housing.

It is characterized in that the spring hook portion comprises a flexible portion that extends to span between outer peripheral surfaces of the first and second housing members and that is formed into a beam supported at only one end thereof on the outer peripheral surface of the first housing member; and an engaging portion that is formed at a position of the flexible portion, the position being opposed to the outer peripheral surface of the second housing member, the engaging portion being engaged with the outer peripheral surface of the second housing member.

The spring hook portion may be formed on at least two positions that are outside of the joining surfaces and are opposed to each other. An outer peripheral surface recessed portion that is recessed in an engagement direction of the engaging portion may be formed on the outer peripheral surface of the second housing member at a position opposed to the engaging portion, the engaging portion may be formed with an engaging projection portion that is projected in the engagement direction of the engaging portion at a position opposed to the outer peripheral surface recessed portion, and the engaging projection portion may be fitted into the outer peripheral surface recessed portion to achieve an engagement. An outer peripheral surface projection portion that is projected in a direction opposite to an engaging direction of the engaging portion may be formed on the outer peripheral surface of the second housing member at a position opposed to the engaging portion, the engaging portion may be formed with an engaging recessed portion that is recessed in the direction opposite to the engaging direction of the engaging portion, at a position opposed to the outer peripheral surface projection portion, and the engaging recessed portion may receive the outer peripheral surface projection portion to achieve an engagement.

The sealing groove may be formed on an inner side of the housing on the joining surface of one of the first and second housing members, and the protruding rib may be formed on an inner side of the housing on the joining surface of the another of the first and second housing members.

The electronic control device may further comprise first and second flange portions that are respectively projected at positions outside of the joining surfaces on outer peripheral surfaces of the first and second housing members and that are stacked by joining the first and second housing members; and first and second through holes that are respectively formed through the first and second flange portions and are concentrically positioned in a stacked position. A hole wall of one of the first and second through holes on a side of a stacking direction may be projected to have a tubular shape in the stacking direction by a projection length equivalent to a through hole length of another of the first and second through holes and is fitted into the another. The first and second flange portions may be fastened together by a screwing means. The screwing means may comprise an external screw portion having a screw shaft that has a bar shape and that passes through one of the first and second through holes; and an internal screw portion that is screwed on one end side of the screw shaft that is projected by passing through one of the first and second through holes. The first and second through holes may be formed at at least two positions outside of the joining surfaces.

The first housing member and the spring hook portion may be monolithically formed by using a resin material.

As mentioned above, according to the present invention, it becomes possible to join two housing members, while suppressing a positional displacement, etc., to obtain a desired sealing property on the joining surfaces.

MODE FOR IMPLEMENTING THE INVENTION

Figure 1:
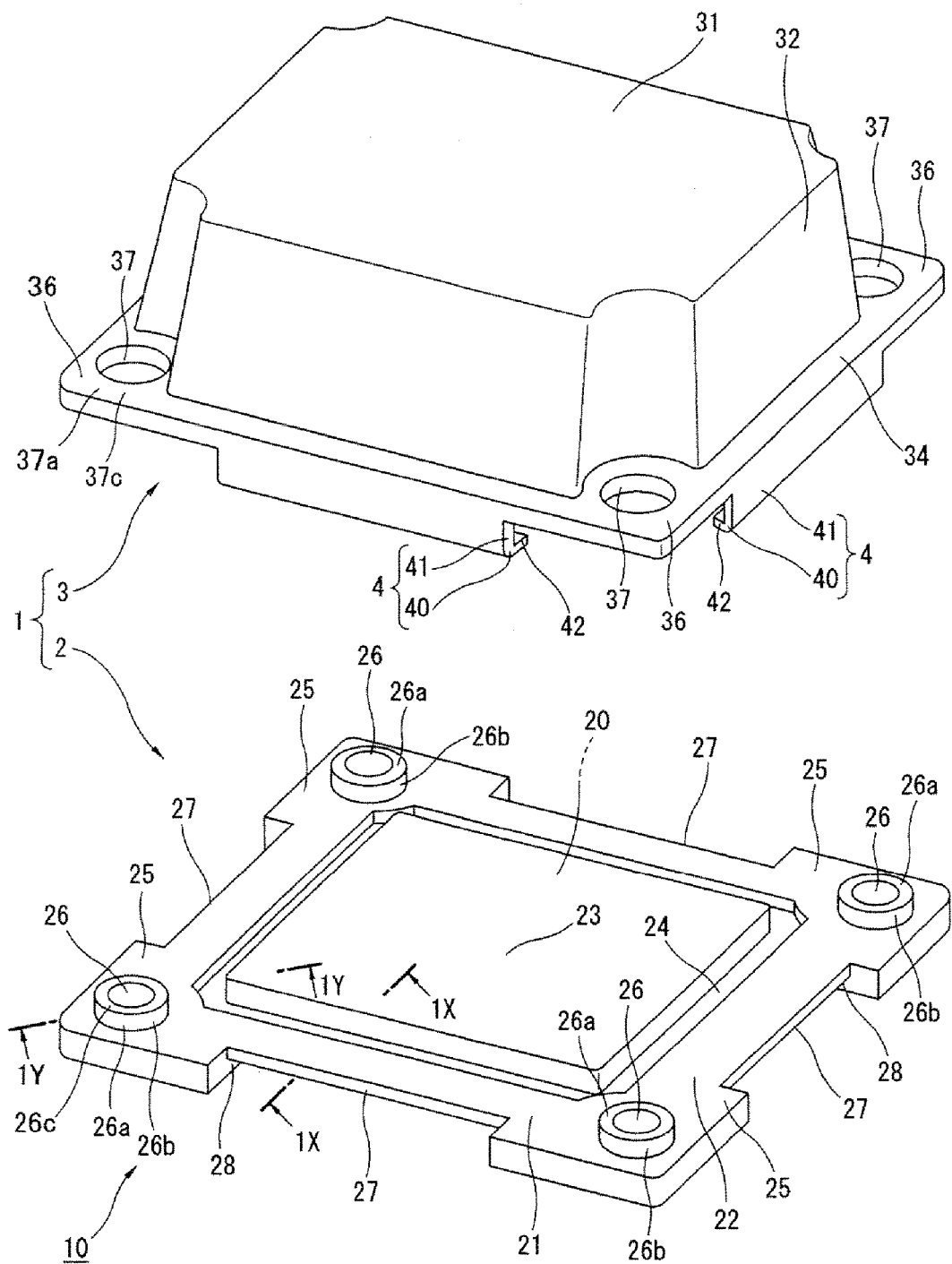
FIG. 1 is an exploded perspective view (perspective view from an upper side) of an electronic control device in the present embodiment.

An electronic control device of an embodiment of the present invention is one in which at least first and second housing members are joined together and in which an electronic component unit is received in a space inside of a housing having their joining surfaces sealed. It is completely different from a structure to conduct sealing by simply using an elastic packing or sealing material. That is, an electronic control device of the present embodiment has a structure in which a sealing groove (for example, the after-mentioned sealing groove 24) is formed on the joining surface of one of the first and second housing members (for example, the after-mentioned base 2 and cover 3), in which a protruding rib (for example, the after-mentioned protruding rib 35) that is fitted into the sealing groove is formed on the other joining surface, and which is equipped with a spring hook portion (for example, the after-mentioned spring hook portion 4) that is positioned outside of the joining surfaces on an outer peripheral side of the housing.

The spring hook portion is equipped with a flexible portion that extends to span between outer peripheral surfaces of the first and second housing members and that is formed into a beam supported at only one end thereof on the outer peripheral surface of the first housing member, and an engaging portion (for example, the after-mentioned engaging projection portion 42 or engaging recessed portion 43) that is formed at a position of the flexible portion, the position being opposed to the outer peripheral surface of the second housing member, the engaging portion being engaged (engaged in a hooking manner) with the outer peripheral surface of the second housing member.

According to a structure like that of the present embodiment, even before the sealing material introduced into the sealing groove hardens (hardens in a condition that the protruding rib is fitted), both of the first and second housing members are positioned and held by the spring hook portion. Therefore, for example, even in a condition in which they are not fastened together by screws (for example, screws 37e of the after-mentioned first embodiment) or the like, positional displacement, etc. by transportation, assembly operation, etc. is suppressed. With this, it becomes possible to obtain a desired sealing property on the joining surfaces by the joining through hardening of the sealing material.

As long as an electronic control device of the present embodiment has the above-mentioned structure which is equipped with the first and second housing members, the spring hook portion, etc. and in which sealing is achieved by fitting between the sealing groove and the protruding rib, various modifications are possible, for example, by a suitable application of common technical knowledge in various fields, etc. The housing members, such as the first and second housing members, are not particularly limited in shape, material, etc., as long as they are joined together to construct a housing that can receive an electronic component unit equipped with a semiconductor switching element, a control circuit, etc., in inside of the housing. It is possible to cite a suitable application of various materials capable of providing various characteristics, such as heat radiation, noise resistance, durability (heat resistance, weather resistance, strength, etc.), etc., depending on the target electronic control device's use environment, etc. For example, it is possible to cite application of the after-mentioned base 2 made of metal and cover 3 made of resin.

In the case of applying a resin article to the first housing member on which a flexible portion (flexible portion in the form of a beam supported at only one end thereof) of the spring hook portion is formed, it becomes easy to obtain flexibility at the flexible portion, as compared with applying a metal article. Furthermore, as to the working method related to the first and second housing members, etc., it is possible to suitably apply various methods as long as they can form, for example, the above-mentioned sealing grooves, protruding ribs, spring hooks, etc. For example, it is possible to cite various working methods, such as molding working, press working, sheet metal working, etc.

As long as the sealing material is one capable of sealing the first and second housing members with an interposal between the sealing groove and the protruding rib, it can suitably be applied depending on the target electronic control device's use environment, etc. It is possible to cite various sealing materials having, for example, sealing property, adhesion, and durability (corrosion resistance, heat resistance, weather resistance, compression set resistance, etc.). As specific examples, various gaskets (FIPG, CIPG, etc.) and adhesives are considered to be applied.

<<Structural Example of Electronic Control Device>>

Figure 2:
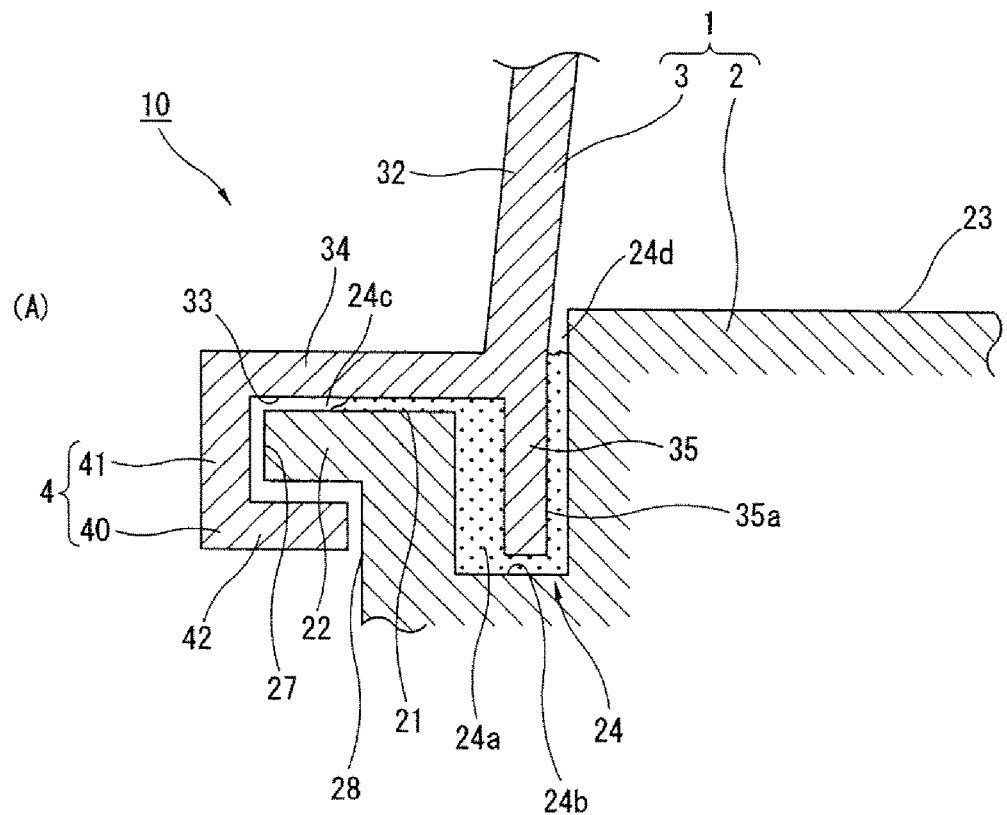
FIG. 2 are schematic sectional views taken along lines 1X-1X and 1Y-1Y of FIGS. 1 ((A) and (B) are respectively sectional views in a joined condition)
Figure 2:
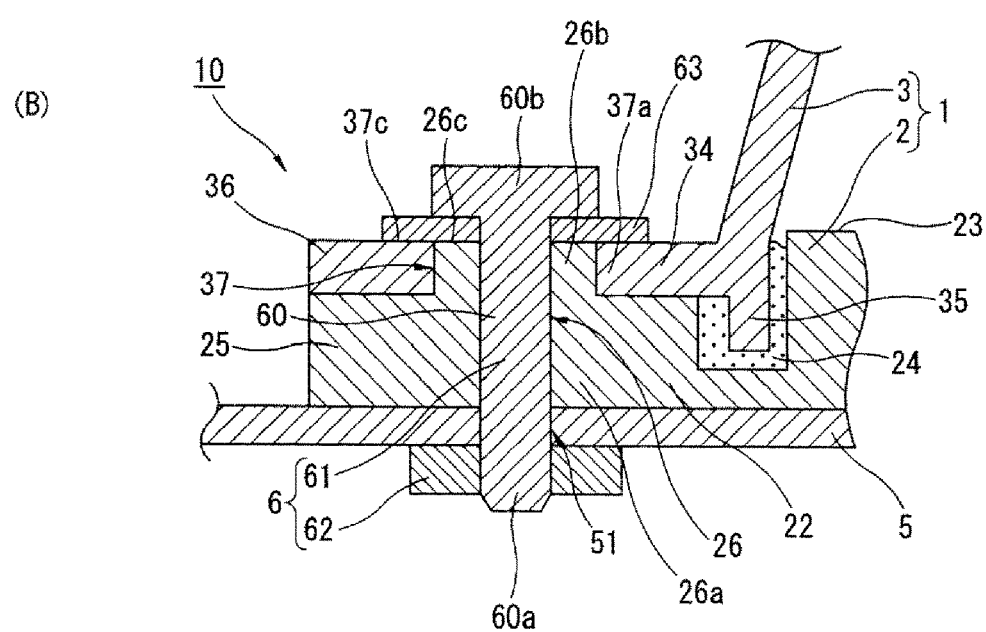
Figure 3:
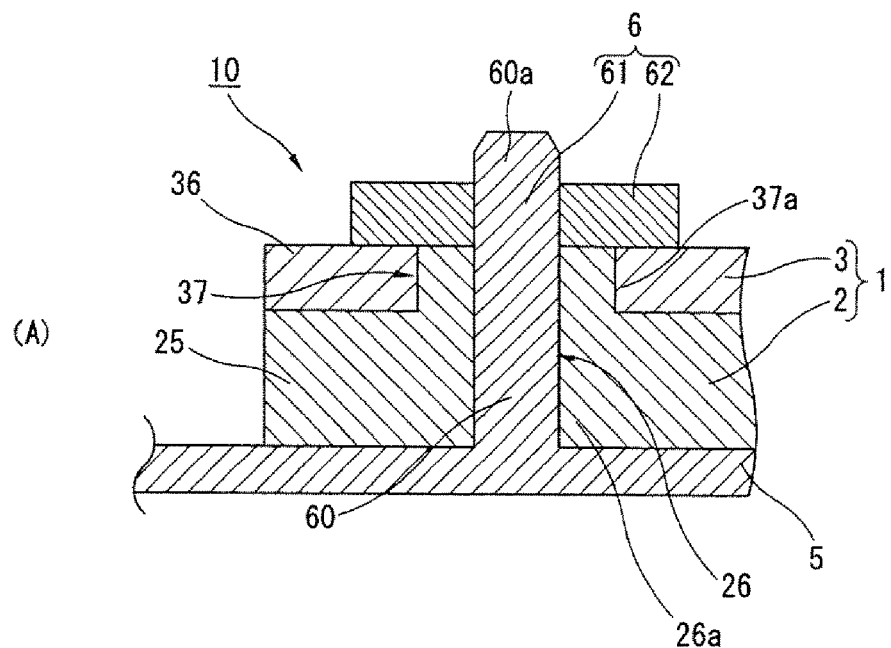
FIG. 3 are schematic sectional views taken along lines 1Y-1Y of FIG. 1 (sectional views in a joined condition)
Figure 3:
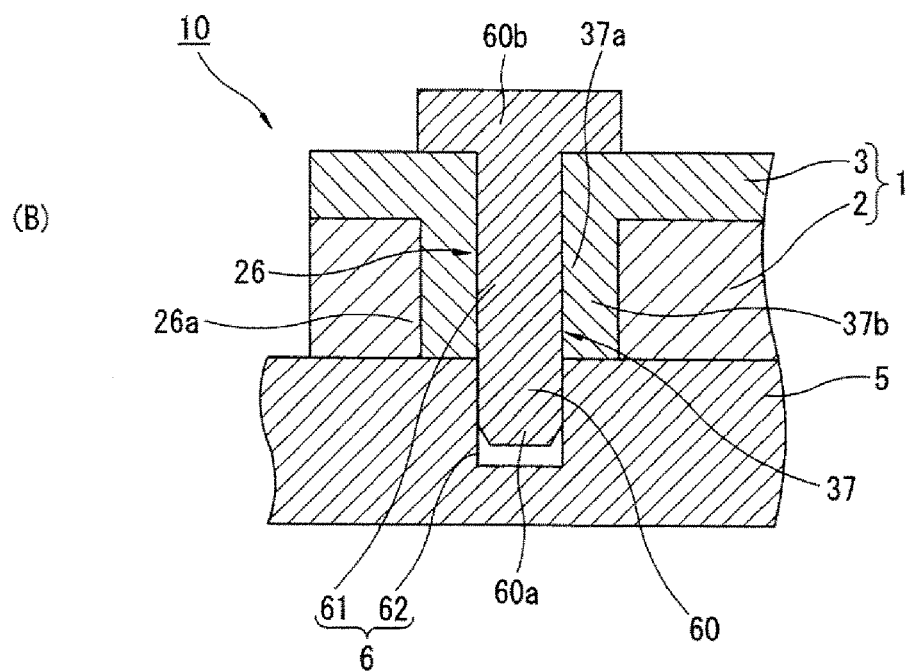

An electronic control device (hereinafter suitably referred to simply as device) 10 shown in FIG. 1 to FIG. 3 is one showing one example of the present embodiment, and it is one showing one example applied to a motor drive inverter, etc. to be mounted on an electric vehicle. In the explanation herein, as a matter of convenience, an explanation may be conducted under the condition that the vertical direction (the first and second house member's joining direction) of FIG. 1 corresponds to the vertical direction of the device 10 itself. This does not necessarily correspond to the vertical direction in a vehicle-mounted condition. For example, in case that it takes a stand-up posture in the vehicle-mounted condition, the vertical direction of the device 10 in FIG. 1 turns to be along the front-back direction or transverse direction of an electric vehicle.

As shown in particularly FIG. 1, firstly, the device 10 is generally constructed of a housing 1 prepared by arranging a generally platy base 2, which is attached to the vehicle body side (for example, a vehicle body panel or a supporting frame of a vehicle body's motor room) not shown in the drawings, and a generally box-shape cover 3 to be opposed to each other and then achieving a liquid-tight joining (joining through the after-mentioned sealing material 24a) therebetween, and an electronic component unit (omitted in the drawings) that is formed of a circuit board with various electronic components mounted thereon, etc. and is received in a protective space inside of the housing 1.

The base 2 is formed by using a metal material superior in thermal conductivity, such as aluminum, has a generally platy shape having a predetermined thickness, and has a generally rectangular shape in plan view as shown in particularly FIG. 1. This base 2 is formed at its outer periphery with a flange portion 22 (for example, corresponding to the first or second flange portion) that extends along the outer periphery and that has a joining surface 21 to be joined with the cover 3. Furthermore, the base 2 is formed at its center portion (inner peripheral side of the flange portion 22) on the upper side (inner side of the housing 1) with a generally rectangular seat portion 23 that is capable of seating thereon an electronic component unit 20 (its detailed showing is omitted). Furthermore, a continuous sealing groove 24 that extends along the joining surface 21 is formed on the inner side (toward the seat portion 23) of the housing 1 on the joining surface 21, such that a desired sealing material 24a can be introduced into the sealing groove 24.

The flange portion 22 is provided at its four corners with bracket portions 25 that are used for the attachment of the device 10 to the vehicle body side. These bracket portions 25 are respectively provided with attaching holes 26 (for example, corresponding to first or second through holes) passing therethrough in the vertical direction (for example, the direction in which stacking is conducted by placing thereon the bracket portion 36 of the after-mentioned flange portion 34 by its joining with the cover 3). A hole wall 26a of the attaching hole 26 of FIG. 1 and FIG. 2 is in a shape having a tubular hole wall portion 26b where an upper side (the stacking direction side) of the hole wall 26a is upwardly projected to have a tubular shape. The tubular hole wall portion 26b is configured (a detailed example is mentioned hereinafter based on FIG. 2(B), etc.) to be fittable into the after-mentioned fastening hole 37 (for example, corresponding to the second or first through hole).

Each of four sides of the flange portion 22 is formed with a cutout portion 27 into which the flexible portion 41 of the after-mentioned spring hook portion 4 is fitted from the outer peripheral side of the housing 1. Furthermore, each cutout portion is formed on its underside with an outer peripheral surface recessed portion 28 into which the engaging portion 40 of the after-mentioned spring hook portion 4 is engaged and which has a shape (a shape into which, for example, the after-mentioned engaging projection portion 42 is fittable) that is recessed in an engagement direction of the engaging portion 40.

The cover 3 is monolithically formed to have a generally box shape by using, for example, a resin material (for example, a synthetic resin material with a lower weight and a lower cost, as compared with metal materials). It is equipped with an upper wall portion 31 that covers from the upper side the electronic component unit 20 seated on the seat portion 23, a side wall portion 32 surrounding four sides of the periphery of the upper wall portion 31, and a flange portion 34 (for example, corresponding to the first or second flange portion) that is formed on the outer periphery of the side wall portion 32 and that has a joining surface 33 to be joined with the joining surface 21 of the base 2. It has a shape having a predetermined thickness. Furthermore, on the inner side of the housing 1 on the joining surface 33, there is formed a continuous protruding rib 35 that extends along the joining surface 33 at a position opposed to the sealing groove 24 under the joined condition. This protruding rib 35 has a shape downwardly projected from the position opposed to the sealing groove 24 on the joining surface 33 and is formed to be fittable into the sealing groove under the joined condition.

Furthermore, at positions opposed to the bracket portions 25 at four corners of the flange portion 34, there are provided bracket portions 36 used for fastening the cover 3 onto the base 2. These bracket portions 36 are respectively provided with fastening holes 37 passing therethrough in the vertical direction (for example, the direction in which stacking is conducted by placing thereon the bracket portion 25 of the flange portion 22 by its joining with the base 2). The fastening hole 37 of FIG. 1 and FIG. 2 is positioned to be opposed to the attaching hole 26 under the joined condition and is configured such that the tubular hole wall portion 26b of the attaching hole 26 is fitted thereinto to achieve a mutual fitting.

Each of four sides of the flange portion 34 is formed with a spring hook portion 4 that is fitted into the opposing cutout portion 27 in the joined condition. The spring hook portion 4 is equipped with a flexible portion 41 that extends to project downwardly (toward the base 2) from the outer periphery of the flange portion 34 and that is formed into a beam supported at only one end thereof, and an engaging portion 40 that is formed at a tip end side of the flexible portion 41 and that is engaged into the outer peripheral surface recessed portion 28. This engaging portion 40 is formed with an engaging projection portion 42 of a shape that projects toward the inside of the housing 1 and that is fittable into the outer peripheral surface recessed portion 28.

<<Joining Example>>

In the case of joining the cover 3 equipped with the spring hook portion 4 and the base 2 mentioned above, the sealing groove 24 is previously filled with the sealing material 24a. As shown in FIG. 1, the base 2 and the cover 3 are brought close to each other from an opposed arrangement condition, and the engaging portion 40 is moved from an upper side to a lower side with an elastic deformation of the flexible portion 41. With this, the engaging portion 40 moves over the outer periphery of the flange portion 22 (the cutout portion in FIG. 1 and FIG. 2) and is engaged (engaged in a snap-fit manner) into the outer peripheral surface recessed portion 28 in a hooking manner. As a result, the flexible portion 41 extends to span between the outer peripheral surfaces of the flange portions 22, 34 (that is, between the outer peripheral surfaces of the base 2 and the cover 3) in a stacked condition. Specifically, in the case of the spring hook portion 4 shown in FIG. 1 and FIG. 2, the engaging projection portion 42 is fitted into the outer peripheral surface recessed portion 28 to achieve an engagement in a hooking manner.

With this, as shown in particularly FIG. 2(A), the spring hook portion 4 takes a position outside of the joining surfaces 21, 33 on the outer peripheral side of the housing 1. At this position, it is possible to position and hold the base 2 and the cover 3 to fix them. By this fixation, the joined condition is maintained, and it turns out to suppress the positional displacement, separation, etc., caused by, for example, transportation, assembly operation, etc.

Furthermore, as shown in FIG. 2(A), the protruding rib 35 is fitted into the sealing groove 24 in a manner to be embedded in the sealing material 24a. As a result, its fitting surface (fitting surface defined by an inner wall surface 24b of the sealing groove 24 and an outer peripheral surface 35a of the protruding rib 35) is sealed (that is, the joining surfaces 21, 33 are sealed) with the sealing material 24a. According to such structure by fitting and joining between the sealing groove 24b and the protruding rib 35, it becomes easy to secure the joining area, thereby also contributing to the joining strength (adhesion strength by, for example, an adhesive sealing material), as compared with, for example, a joining structure simply between flat surfaces.

The amount of the sealing material 24a introduced into the sealing groove 24 can suitably be set. For example, it can be set such that the sealing material 24a remains only on the fitting surface between the sealing groove 24 and the protruding rib 35 to the extent that the sealing groove 24 is filled. In case that the amount of the sealing material 24a exceeds that filling the groove, its excess turns to move into a fine gap 24c excluding the fitting surface of the joining surfaces 21, 33 and/or move into a fine gap 24d between the sealing groove 24 and the base 23, as shown in FIG. 2(A). In FIG. 2(A), the sealing groove 24 and the protruding rib 35 are formed on an inner side of the housing 1 on the joining surfaces 21, 33, and the non-fitting surface (the fine gap 24c) is positioned on an outer peripheral side of the housing 1 on the joining surfaces 21, 33.

Therefore, it is possible to suppress leakage of the sealing material 24a to the outer peripheral side of the housing 1, for example, by extending the distance in the inside-outside direction of the housing 1 in the fine gap 24c. With this, it is also possible to maintain external appearance. Furthermore, it is possible to suppress outflow (outflow toward the surface of the seat portion 23, etc.) of the sealing material 24a toward the inner side of the housing 1, for example, by forming the seat portion to have a large height (a large distance between the sealing groove 24 and the seat portion 23).

The spring hook portion 4 is not limited to the configuration shown in FIG. 1. It is possible to apply various configurations, as long as it is positioned outside of the joining surfaces 21, 33 on the outer peripheral side of the housing 1 and has a structure that is capable of positioning, holding and fixing the base 2 and the cover 3 in a snap-fit manner at that position. For example, the after-mentioned first and second embodiments, etc. can be mentioned.

Furthermore, in FIG. 1, the spring hook portions 4 are provided at four positions outside of the joining surfaces 21, 33 on the outer peripheral side of the housing 1. However, as long as it has a structure in which the spring hook portions 4 are provided at at least two opposing positions outside of the joining surfaces 21, 33, it is possible to sufficiently fix the base 2 and the cover 3.

<<Exemplary Attachment of the Device 10 to the Vehicle Body>>

As shown in FIG. 2(B), it is possible to attach and fix the device 10 prepared by joining the base 2 and the cover 3 as shown in FIG. 2(A) to the vehicle body's supporting frame (or vehicle body panel) through a screwing means 6 for the attachment and the fixation having an external screw portion 61 and an internal screw portion 62.

In FIG. 2(B), the base 2 and the cover 3 are joined together such that the respective bracket portions 25, 36 of the flange portions 22, 34 are stacked and that the tubular hole wall portion 26 of the attaching hole 26 is fitted into the fastening hole 37, thereby providing a structure in which positional displacement between the base 2 and the cover 3 is suppressed. Furthermore, the attaching hole 26, the fastening hole 37 and the supporting hole 51 of the supporting frame 5 are concentrically positioned, and it takes a positioned condition enabling the device 10 to be attached and fixed to the supporting frame 5. Furthermore, the projection length of the tubular hole wall portion 26b and the through hole length of the fastening hole 37 are equivalent (the same or substantially the same) to each other, and the opening peripheral surfaces 26c, 37c are flush with each other in the positioned condition.

The screwing means 6 in FIG. 2(B) has a structure that enables the device 10 to be attached and fixed to the supporting frame 5 by passing from above a bar-shape screw shaft 60 of the external screw portion 61 through the attaching hole 26 and the supporting hole 51 in the positioned condition and then screwing and fastening an internal screw portion 62 onto one end side 60a of the screw shaft 60 projecting from the attaching hole 26 and the supporting hole 51 by the passing therethrough. In the case of FIG. 2(B), a head portion 60b is formed on the other end side of the screw shaft 60, and a platy washer 63 is interposed between the head portion 60b and the opening peripheral surfaces 26c, 37c. By fastening the screwing means 6, the bracket portions 25, 36 (the flange portions 22, 34) are fastened together.

In this manner, the bracket portions 25, 36 are fastened together, and the device 10 is attached and fixed to the supporting frame 5, by the screwing means 6 for the attachment and fixation. This makes it possible to contribute to the joining strength between the base 2 and the cover 3. Furthermore, since the tubular hole wall portion 26b of the attaching hole 26 is fitted into the fastening hole 37, the positional displacement due to fastening force of the screwing means 6, etc. is suppressed. Furthermore, even if adhesive force by the sealing material 23a lowers from the initial condition, it becomes possible to suppress a separation between the base 2 and the cover 3.

The screwing means 6 is not limited to the configuration shown in FIG. 2(B) (for example, a configuration formed of a general bolt having the head portion 60b and a ring-shape nut as shown in FIG. 2(B)), but it is possible to apply various configurations as long as it has a structure enabling the device 10 to be attached and fixed to the supporting frame 5, etc.

For example, in case that the head portion 60b shown in FIG. 2(B) has an outer diameter that is larger than the hole diameter of the fastening hole 37 (for example, in case that the head portion 60b has an outer diameter similar to the outer diameter of the washer 63), it becomes possible to attach and fix the device 10 while similarly fastening the brackets 25, 36 together, even if the washer 63 shown in FIG. 2(B) is not applied. Furthermore, as shown in FIG. 3(A), it may be a structure in which the supporting frame 5 and the external screw portion 61 are monolithic, and the screw shaft 60 is projected from the supporting frame 5 (a structure formed with the screw shaft 60 in place of the supporting hole 51).

In the case of this configuration of FIG. 3(A), the screw shaft 60 is passed from below through the attaching hole 26 in the positioned condition, and then the internal screw portion 62 is screwed and fastened to one end side 60a of the screw shaft 60 projecting (projecting upwardly) from the attaching hole 26 by the passing therethrough. With this, it is possible to attach and fix the device 10 to the supporting frame 5 and fasten the bracket portions 25, 36 together.

Furthermore, as shown in FIG. 3(B), it may be a structure in which the internal screw portion 62 is united with the supporting frame 5 in place of forming the supporting hole 51 therein. In the case of this configuration of FIG. 3(B), it is possible to pass the screw shaft 60 from above through the attaching hole 26 in the positioned condition and then screw and fasten one end side 60a of the screw shaft 60 projecting (projecting downwardly) from the attaching hole 26 by the passing therethrough into the internal screw portion 62 of the supporting frame 5.

Furthermore, even in the case of a configuration in which, in place of the tubular hole wall portion 26b of the attaching hole 26, a tubular hole wall portion 37b is formed on the hole wall 37a of the fastening hole 37 as shown in FIG. 3(B) to make it possible to fit the tubular hole wall portion 37b into the attaching hole 26, it achieves advantageous effects similar to FIG. 2(B).

Furthermore, in FIG. 1, there is provided a structure in which the attaching holes 26 and the fastening holes 37 are respectively formed on the bracket portions 25, 36 positioned at four corners of the flange portions 22, 34 and in which the screw means 6 are suitably applied at the positions of the attaching holes 26 (for example, the attaching holes 26 of which tubular hole wall portions 26b are fitted into the fastening holes 37). However, according to a configuration in which the screw means 6 can be applied to the attaching holes 26 that are formed at at least two opposed positions outside of the joining surfaces 21, 33, it is possible to sufficiently attach and fix the device 10 to the supporting frame 5.

First Embodiment

Figure 4:
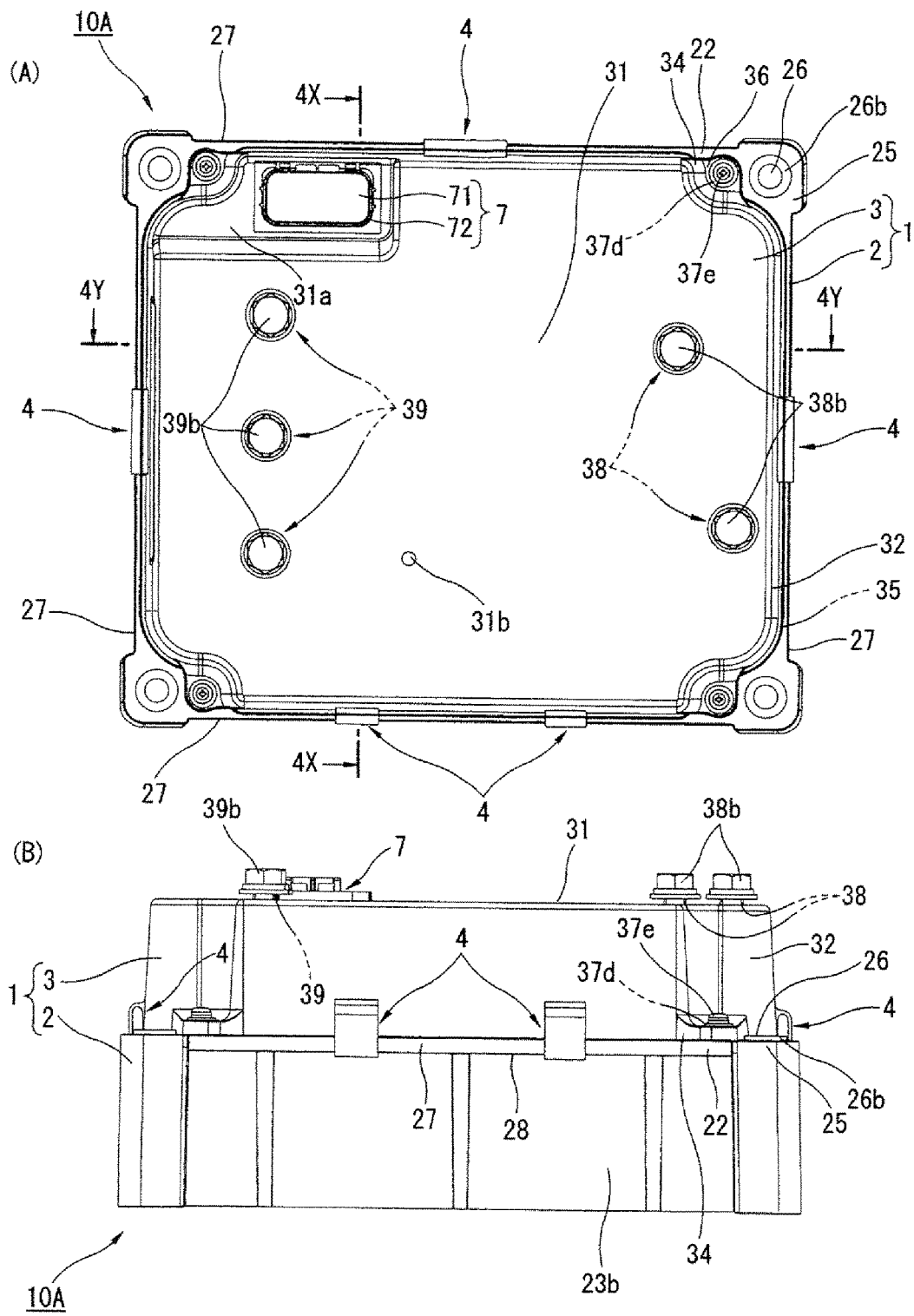
FIG. 4 are schematic explanatory views showing a device 10A in the first embodiment ((A) is a view where the device 10A in the joined condition is viewed from the top, and (B) is a view where that is viewed from one side)
Figure 5:
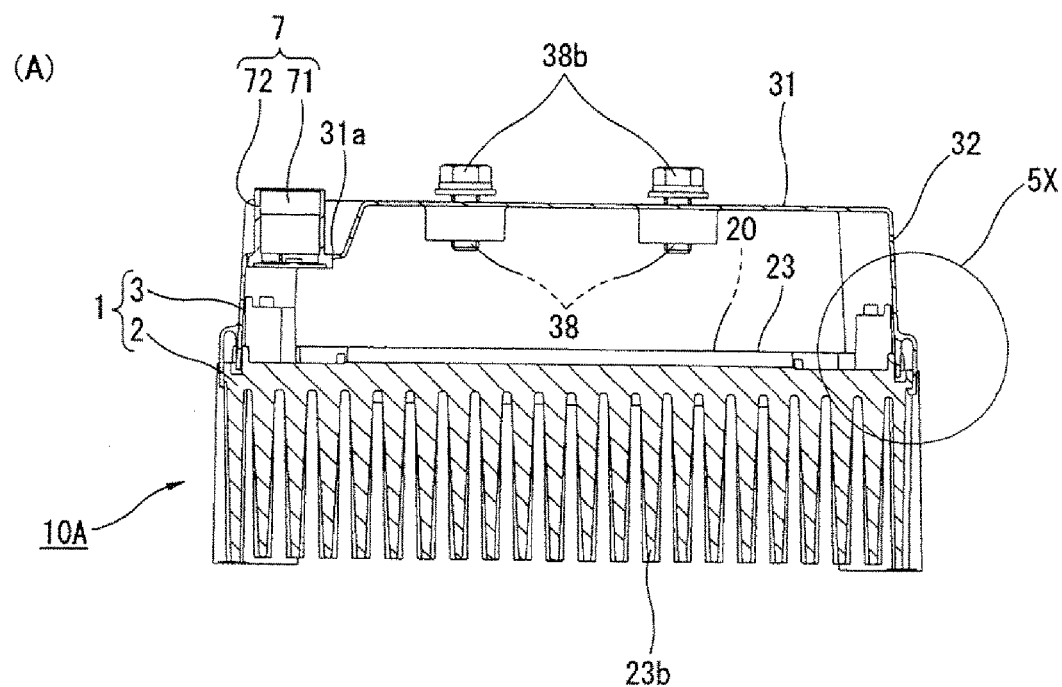
FIG. 5(A) is a schematic sectional view taken along lines 4X-4X of FIG. 4.
FIG. 5(B) is an enlarged fragmentary view in an encircled line 5X.
Figure 5:
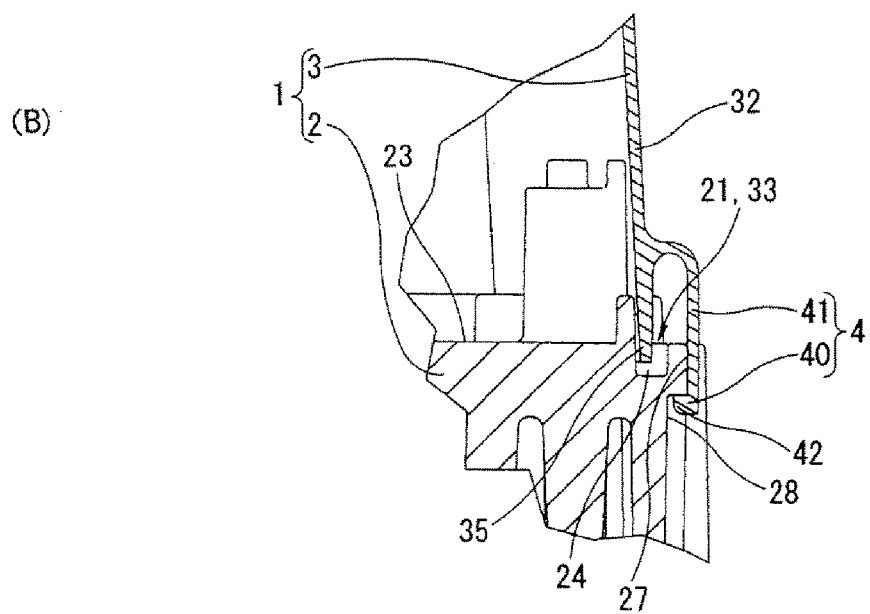
Figure 6:
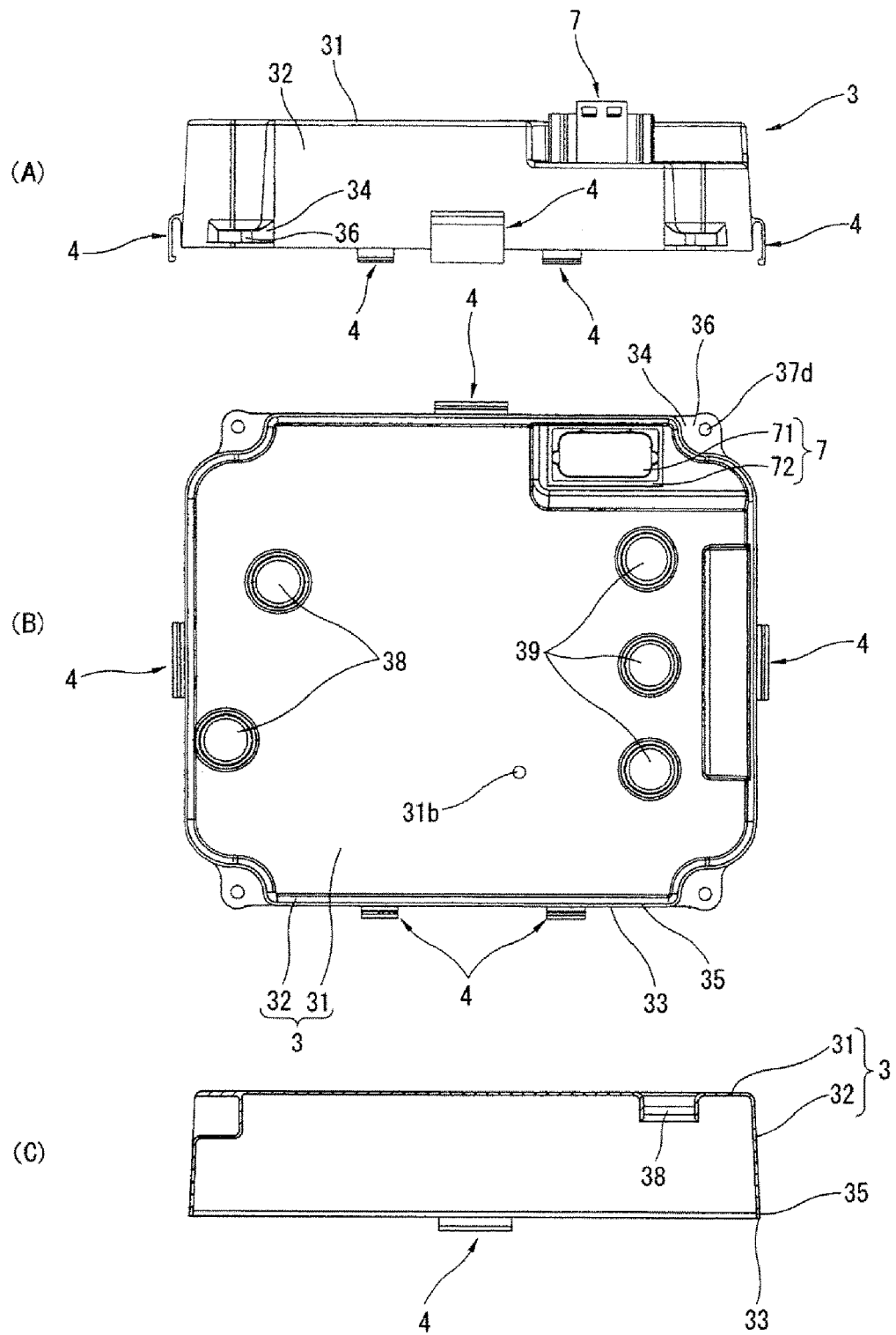
FIG. 6 are schematic explanatory views of a cover 3 of the first embodiment ((A) is a view taken from one side, (B) is a view taken from an inner side of a housing 1, and (C) is a schematic sectional view taken along lines 4Y-4Y of FIG. 4)

A device 10A shown in FIG. 4 to FIG. 7 is a specific one example in the case of applying the device 10 to a motor-driving inverter device. It shows one example of a configuration in which an electronic component unit that is equipped with an inverter circuit (not shown in the drawings) by a switching element, etc. and that is for driving a motor not shown in the drawing is received in the inside of the housing 1. By using the same symbols for those similar to ones of FIG. 1 to FIG. 3, etc., their detailed explanations are suitably omitted. Furthermore, for example, FIG. 5 show the joined condition. The sealing groove 24 is filled with the sealing material 24a, and the protruding rib 35 is fitted thereinto. For convenience, however, the drawing of the sealing material 24a is omitted.

In the first embodiment, the base 2 is provided on the back surface (the surface on the outer peripheral side of the housing 1) of the seat portion 23 with heat radiation fins 23b that are projected from the back surface to have a thin rectangular shape and that are in parallel to have predetermined intervals. By these heat radiation fins 23b, the surface area of the base 2 on the outer peripheral side of the housing 1 becomes large, and it becomes easy to radiate heat coming from the electronic component unit 20 seated on the seat portion 23.

The cover 3 of the first embodiment is formed with a recessed portion 31a having a shape recessed on one corner side of the four corners, and this recessed portion 31a is provided with a connector 7 for external connection. This connector 7 is equipped with a connection hole 71 passing through the recessed portion 31a of the top wall portion 31, and a sleeve-shape fitting portion 72 that surrounds an opening periphery of the connection hole 71 and that is fittable into an external equipment connector not shown in the drawings. Through such connector 7, it becomes possible to have an electric connection between an external equipment not shown in the drawings and the electronic component unit 20 in the inside of the housing 1. With this, it is possible conduct transmission/reception of various signals relative to the electronic component unit 20. As a specific example, it is possible to mention transmission of a drive command signal to each switching element of the inverter circuit of the electronic component unit 20.

Furthermore, the top wall portion 31 of the cover 3 is formed with a direct-current connection hole 38 for connecting a direct-current side terminal 38a (mentioned hereinafter with reference to FIG. 7) of the inverter circuit of the electronic component unit 20 and an external direct-current power source not shown in the drawings, and an alternate-current connection hole 39 for connecting an alternate-current side terminal 39a (mentioned hereinafter with reference to FIG. 7) and a motor not shown in the drawings. These connection holes 38, 39 are formed to pass therethrough in a direction along thickness of the top wall portion 31. In a connection structure by these direct-current connection hole 38 and alternate-current connection hole 39, it is possible to apply various modes. For example, as shown in FIG. 4 and FIG. 5, it is possible to mention a method in which bolts 38b, 39b are respectively passed through the direct-current connection hole 38 and the alternate-current connection hole 39, and the terminals 38a, 39a are connected through those bolts 38b, 39b to wirings (not shown in the drawings) for connections of an external direct-current power source and a motor, not shown in the drawings.

Figure 7:
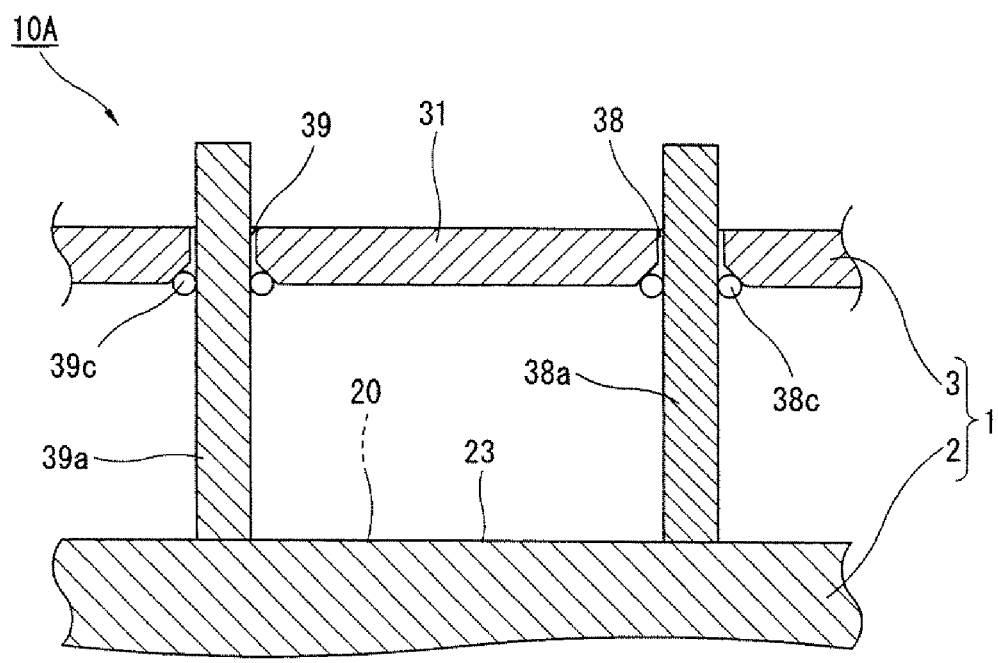
FIG. 7 is a schematic sectional view (a schematic sectional view taken along lines deviated from lines 4X-4X of FIG. 4) for explaining a direct current connection hole 38 and an alternating current hole 39 of the first embodiment.

Furthermore, as shown in FIG. 7, it is also possible to mention a structure in which the terminals 38a, 39a projecting from the electronic component unit 20 are respectively passed through the direct-current connection hole 38 and the alternate-current connection hole 39 to achieve connections (direct connections without using the bolts 38b, 39b, etc.) with wirings for connections of an external direct-current power source and a motor, not shown in the drawings. As shown in FIG. 7, in case that there are gaps between the terminals 38a, 39a and the direct-current connection hole 38 and the alternate-current connection hole 39, it is preferable to make sealing by interposing sealing members 38c, 39c, such as O-rings, at the gaps.

As shown in particularly FIG. 5, the protruding rib 35 of the first embodiment is formed at a tip end periphery of the side wall portion of the cover 3 and is configured to be fittable into the sealing groove 24 under the joined condition. Furthermore, as shown in particularly FIG. 5, the spring hook portion 4 is projectingly formed on an outer peripheral surface of the side wall portion 32, and is equipped with a flexible portion 41 that extends downwardly (toward the base 2) and that is formed into a beam supported at only one end thereof, and with an engaging portion 40 that is engaged at a tip end side of the flexible portion 41 into an outer peripheral surface recessed portion 28. The engaging portion 40 is formed with an engaging projection portion 42 that projects in an inside direction of the housing 1 and that is fitted into the outer peripheral surface recessed portion 28. Of four sides of the side wall portion 32, each of the three sides is provided with one spring hook portion 4, and the remaining one side (the front side in FIG. 4(B)) is provided with two spring hook portions 4 at a predetermined interval.

According to a configuration using the spring hook portions 4 as in the first embodiment, the base 2 and the cover 3 are positioned and held. Therefore, the positional displacement, etc. is sufficiently suppressed even if a separate fastening is not conducted, but it is optional to conduct a reinforcing fastening by using screws 37e as shown in the following.

In the case of the first embodiment, at the flange portion 34 and the bracket portions 36, they are formed at positions shifted from the bracket portions 25 (positions not opposed to the bracket portions 25) at four corners on the outer peripheral side of the tip end periphery of the side wall portion 32. In place of the fastening hole 37, a screw hole 37d is formed at the bracket portion 36. In the joined condition, the screw 37e is passed through the screw hole 37d and is screwed to the bracket 25 (screwed into a screw hole not shown in the drawings), thereby making a configuration enabling the base 2 and the cover 3 to be fastened together. Even if they are fastened together by screws 37e in this manner, positional displacement, etc. of the base 2 and the cover 3 are suppressed by the spring hook portions 4.

In case that the device 10A configured as mentioned above is applied by mounting it in a motor room or the like of an electric vehicle and that stress may occur in the housing 1 by the pressure increase or decrease in the inside of the housing 1, it is optional to make a configuration equipped with a so-called breathing filter function, for example, by forming a ventilation hole 31b that passes through the top wall portion 31 in its thickness direction. This breathing filter function is a generally known technology as shown, for example, in JP Patent Application Publication 2006-5162, etc. It is possible to conduct a suitable design change, such as providing a ventilation waterproof film (not shown in the drawings) at a ventilation hole 31b on the inner side of the housing 1, providing a protective wall (for example, a protective wall, not shown in the drawings, for covering by providing a ventilation gap between that and the ventilation hole 31b) at the ventilation hole 31b on the outer peripheral side of the housing 1, etc.

Second Embodiment

Figure 8:
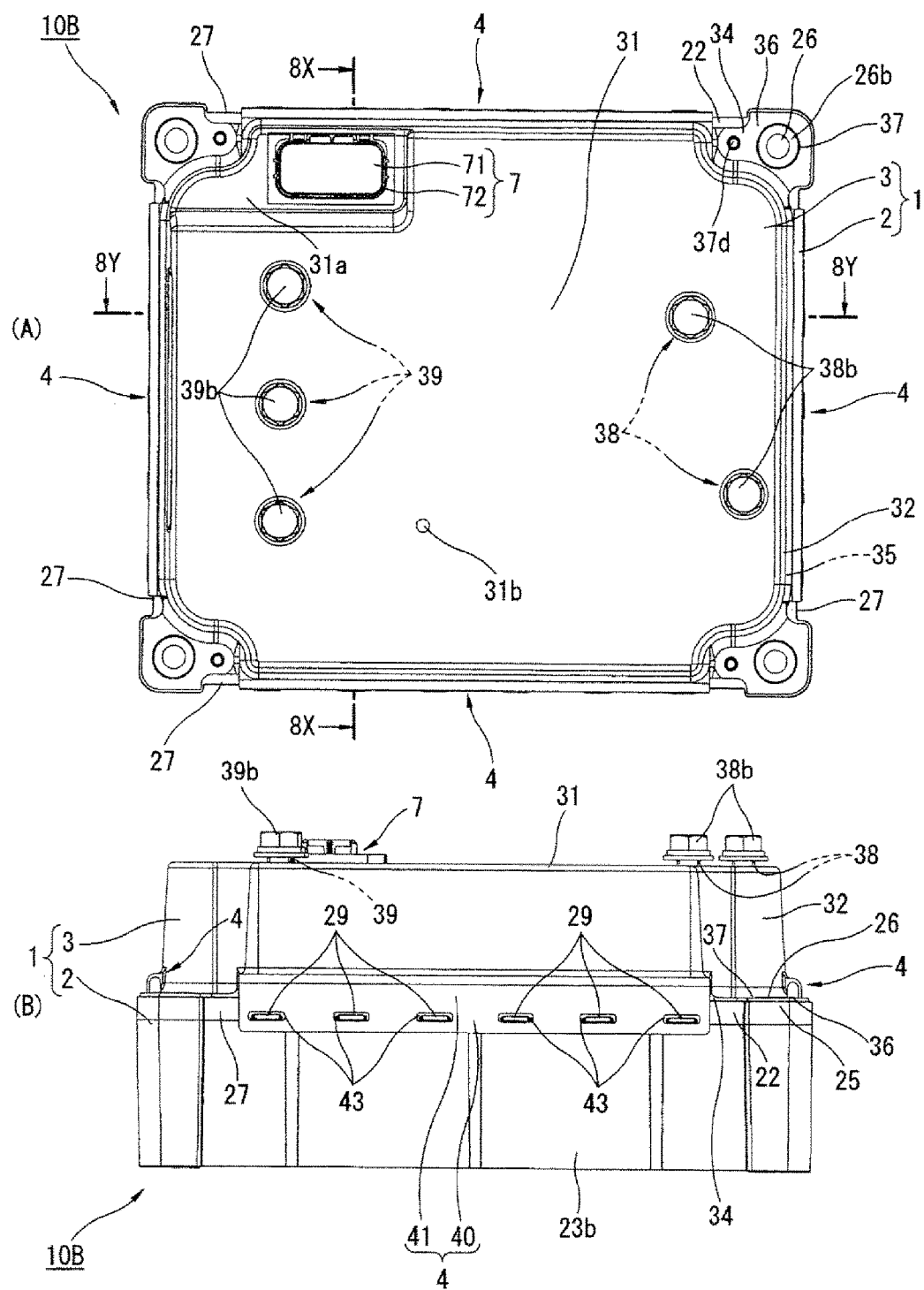
FIG. 8 are schematic explanatory views showing a device 10B in the second embodiment ((A) is a view where the device 10B in the joined condition is viewed from the top, and (B) is a view where that is viewed from one side)
Figure 9:
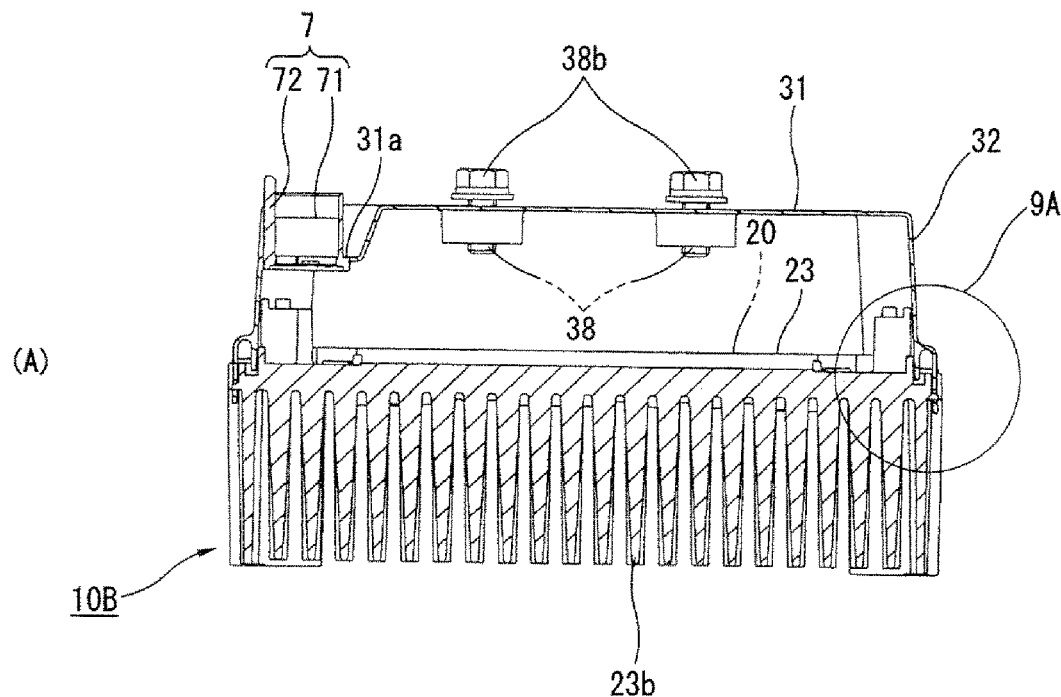
FIG. 9(A) is a schematic sectional view taken along lines 8X-8X of FIG. 8.
FIG. 9(B) is an enlarged fragmentary view in an encircled line 9X.
Figure 9:
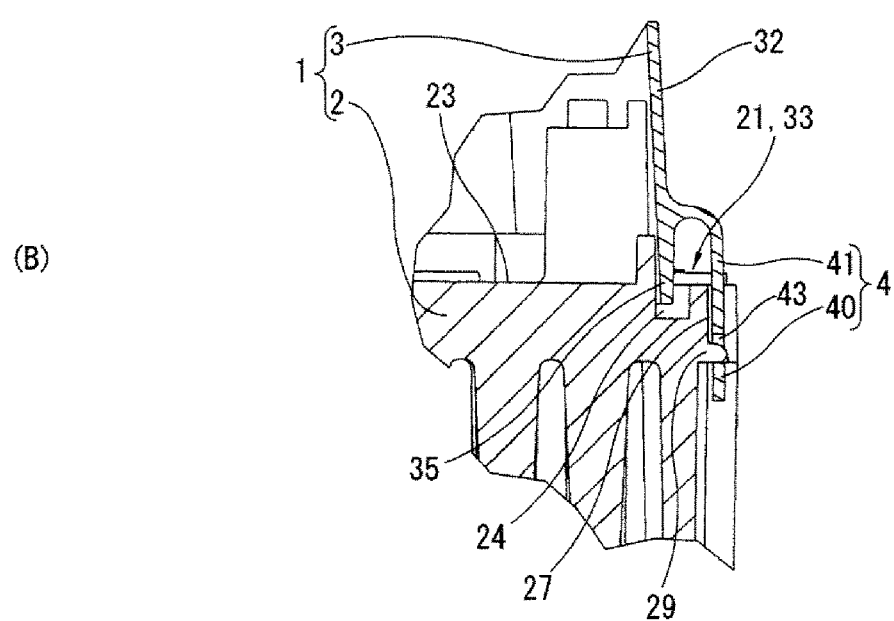
Figure 10:
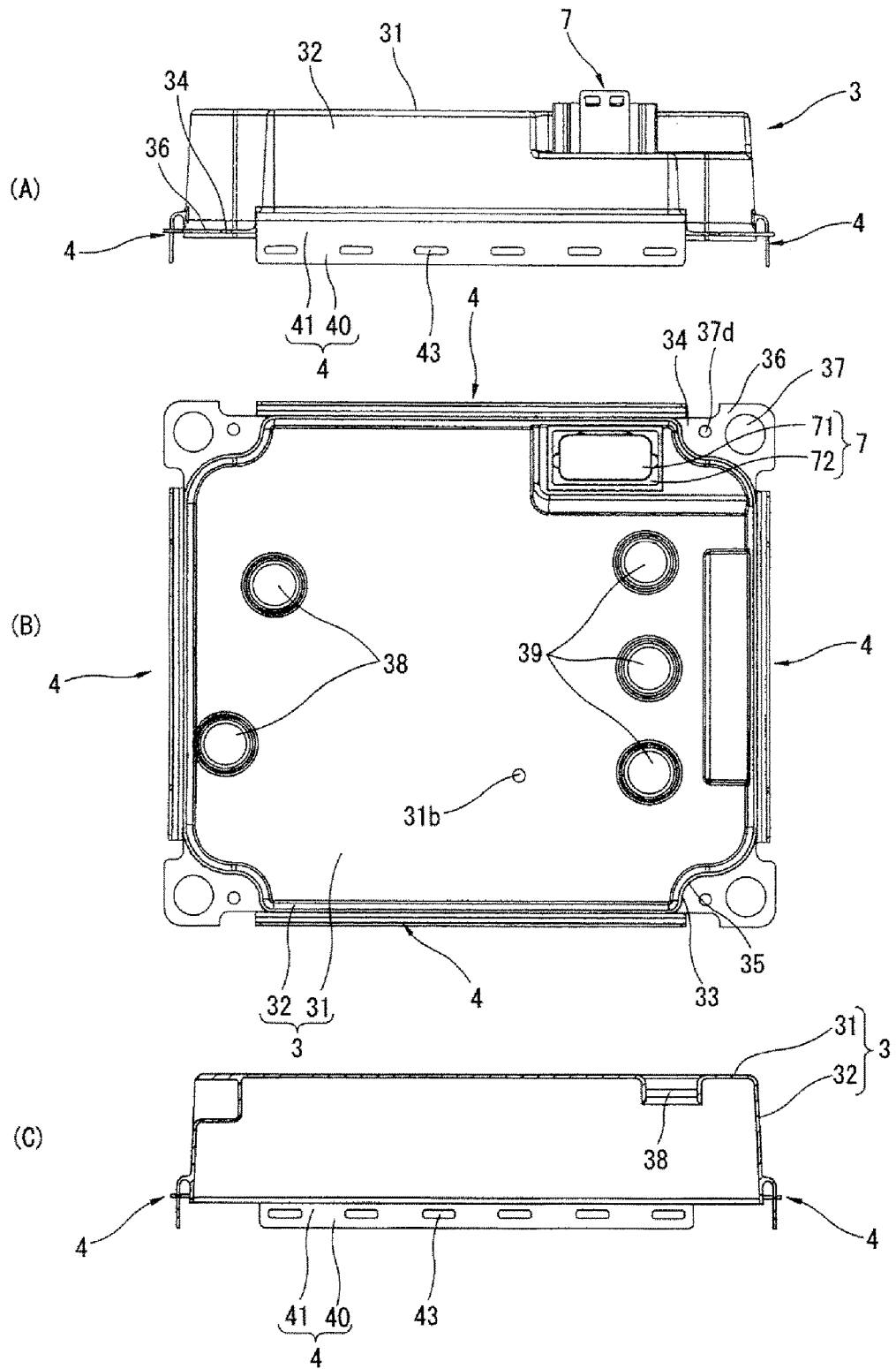
FIG. 10 are schematic explanatory views of a cover 3 of the second embodiment ((A) is a view taken from one side, (B) is a view taken from an inner side of a housing 1, and (C) is a schematic sectional view taken along lines 4Y-4Y of FIG. 8).

A device 10B shown in FIG. 8 to FIG. 10 is shown as another specific example of a motor-driving inverter device according to the present embodiment. It shows one example of a configuration in which an electronic component unit that is equipped with an inverter circuit (not shown in the drawings) by a switching element, etc. and that is for driving a motor not shown in the drawing is received in the inside of the housing 1. By using the same symbols for those similar to ones of FIG. 1 to FIG. 3 and/or FIG. 4 to FIG. 7, etc., their detailed explanations are suitably omitted. Furthermore, for example, FIG. 9 show the joined condition. The sealing groove 24 is filled with the sealing material 24a, and the protruding rib 35 is fitted thereinto. For convenience, however, the drawing of the sealing material 24a is omitted.

In the second embodiment, below each cutout portion 27 at four sides of the flange portion 22 of the base 2, the outer peripheral surface recessed portion 28 as in the first embodiment is not formed, but there is formed an outer peripheral surface projection portion 29 to which an engaging recessed portion 43 of the after-mentioned spring hook portion 4 is engaged and which projects in a direction opposite to the engaging direction of the engaging recessed portion 43. In the second embodiment, a plurality (six) of outer peripheral projection portions 29 are formed to be positioned in parallel at predetermined intervals in a peripheral direction of the flange portion 22.

The spring hook portion 4 formed on the cover 3 of the second embodiment is equipped with a flexible portion 41 that is projectingly provided on an outer peripheral surface of the side wall portion 32 and that is formed into a beam extending downwardly (toward the base 2) and being supported at only one end, and with an engaging portion 40 that is engaged with the outer peripheral surface projection portion 29 at a tip end side of the flexible portion 41. In order to be opposed to the outer peripheral surface projection portions 29 in parallel as mentioned above, the flexible portion 41 of the second embodiment is formed into an elongated platy shape in the parallel direction. Furthermore, the engaging portion 40 is not formed with the engaging projection portion 42 of the first embodiment, but is formed with engaging recessed portions 43 respectively at positions, which are opposed to the outer peripheral surface projection portions 29 in parallel mentioned above, at predetermined intervals in the parallel direction. This engaging recessed portion 43 has a recessed shape (a shape passing therethrough in the second embodiment) in a direction opposite to the engaging direction of the engaging portion 40 and has a shape into which the outer peripheral surface projection portion 29 can be received.

In the case of joining together the cover 3 and the base 2 like those of the second embodiment, as a tip end periphery 40a of the engaging portion 40 is downwardly moved to go over the peripheral edges of the outer peripheral surface projection portions 29, the engaging portion 40 is engaged with the outer peripheral surface projection portions 29 in a hooking manner (a so-called snap-fit engagement). Specifically, as shown in FIG. 8 to FIG. 10, the engaging recessed portions 43 receive the outer peripheral surface projection portions 29 to achieve an engagement in a hooking manner.

According to a configuration using the spring hook portion 4 like that of the second embodiment, similar to the first embodiment, the base 2 and the cover 3 are positioned and held. Therefore, even if they are not fastened together separately, the positional displacement, etc. are sufficiently suppressed. As compared with the first embodiment, it has a configuration in which the tubular hole wall portion 26b of the attaching hole 26 is fitted into the fastening hole 37 and then the base 2 and the cover 3 can be fastened together by the screwing means 6. Therefore, even if adhesive force of the sealing material 23a lowers from the initial condition, it becomes possible to suppress their separation by the fastening force of the screwing means 6.

As above, in the present invention, only specific examples were explained in detail. It is, however, clear to a person skilled in the art that various changes, etc. can be conducted within a range of the technological concept of the present invention. It is natural that such changes, etc. belong to the scope of the claims.

For example, in FIG. 1, etc., even a configuration in which other housing members are suitably joined (that is, a configuration in which at least the first and second housing members are joined together, and their joined surface is sealed) becomes possible to achieve advantageous effects similar to those shown in the present embodiments, as long as it is a configuration which is equipped with the spring hook portions 4, etc. and in which sealing can be achieved by the fitting between the sealing groove 24 and the protruding rib 35. Furthermore, it shows a configuration in which the sealing groove 24 is formed on the joining surface 21 of the base 2 and in which the protruding rib 35 is formed on the joining surface 33 of the cover 3. It is, however, becomes possible to achieve advantageous effects similar to those of the present embodiments, as long as it is a configuration in which the sealing groove 24 or the protruding rib 35 is formed on either joining surface 21 or 33. Furthermore, FIG. 1, etc. show a configuration in which, in the spring hook portion 4, the flexible portion 41 is supported on the cover 3, and the engaging portion 40 is engaged with the cover 3. However, even a configuration in which the flexible portion 41 is supported on the base 2 and in which the engaging portion 40 is engaged with the cover 3 becomes possible to achieve advantageous effects similar to those shown in the present embodiments.

The invention claimed is:

1. An electronic control device, comprising:
   a housing having at least a first housing member and a second housing member that are joined together and that respectively have joining surfaces sealed;
   a sealing groove that is formed on a joining surface of one of the first or second housing members and that is filled with a sealing material;
   a protruding rib that is formed on a joining surface of another of the first or second housing members and that is fitted into the sealing groove;
   a spring hook portion that is positioned outside of the joining surfaces on an outer peripheral side of the housing; and
   an electronic component unit that is received in a space inside of the housing,
   wherein the spring hook portion comprises:
      a flexible portion that extends to span between outer peripheral surfaces of the first and second housing members and that is formed into a beam supported at only one end thereof on the outer peripheral surface of the first housing member; and
      an engaging portion that is formed at a position of the flexible portion opposed to the outer peripheral surface of the second housing member, the engaging portion being engaged with the outer peripheral surface of the second housing member,
   wherein the spring hook portion is formed at at least two positions of the first housing member that are outside of the joining surfaces and are opposed to each other,
   wherein a cutout portion is formed at at least two positions of the second housing member that are outside of the joining surfaces and are opposed to each other,
   wherein the flexible portion of the spring hook portion is fitted into the cutout portion.

2. The electronic control device as claimed in claim 1, wherein an outer peripheral surface recessed portion that is recessed in an engagement direction of the engaging portion is formed on the outer peripheral surface of the second housing member at a position opposed to the engaging portion,
   wherein the engaging portion is formed with an engaging projection portion that is projected in the engagement direction of the engaging portion at a position opposed to the outer peripheral surface recessed portion, and
   wherein the engaging projection portion is fitted into the outer peripheral surface recessed portion to achieve an engagement.

3. The electronic control device as claimed in claim 1, wherein an outer peripheral surface projection portion that is projected in a direction opposite to an engaging direction of the engaging portion is formed on the outer peripheral surface of the second housing member at a position opposed to the engaging portion,
   wherein the engaging portion is formed with an engaging recessed portion that is recessed in the direction opposite to the engaging direction of the engaging portion, at a position opposed to the outer peripheral surface projection portion, and
   wherein the engaging recessed portion receives the outer peripheral surface projection portion to achieve an engagement.

4. The electronic control device as claimed in claim 1, wherein the sealing groove is formed on an inner side of the housing on the joining surface of the one of the first or second housing members, and
   the protruding rib is formed on an inner side of the housing on the joining surface of the another of the first or second housing members.

5. The electronic control device as claimed in claim 1, wherein the electronic control device further comprises:
   first and second flange portions that are respectively projected at positions outside of the joining surfaces on outer peripheral surfaces of the first and second housing members and that are stacked by joining the first and second housing members; and
   first and second through holes that are respectively formed through the first and second flange portions and are concentrically positioned in a stacked position,
   wherein a hole wall of one of the first or second through holes on a side of a stacking direction is projected to have a tubular shape in the stacking direction by a projection length equivalent to a through hole length of another of the first or second through holes and is fitted into the another,
   wherein the first and second flange portions are fastened together by a screwing means, and
   wherein the screwing means comprises:
      an external screw portion having a screw shaft that has a bar shape and that passes through one of the first or second through holes; and
      an internal screw portion that is screwed on one end side of the screw shaft that is projected by passing through the one of the first or second through holes.

6. The electronic control device as claimed in claim 5, wherein the first and second through holes are formed at at least two opposing positions outside of the joining surfaces.

7. The electronic control device as claimed in claim 1, wherein the first housing member and the spring hook portion are monolithically formed by using a resin material.

* * * * *